(12) United States Patent
Bekele et al.

(10) Patent No.: US 11,637,528 B1
(45) Date of Patent: Apr. 25, 2023

(54) WIDE FREQUENCY RANGE VOLTAGE CONTROLLED OSCILLATORS

(71) Applicant: XILINX, INC., San Jose, CA (US)

(72) Inventors: Adebabay M. Bekele, San Jose, CA (US); Parag Upadhyaya, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/689,748

(22) Filed: Mar. 8, 2022

(51) Int. Cl.
*H03B 5/12* (2006.01)
*H03L 7/099* (2006.01)
*H03B 5/18* (2006.01)

(52) U.S. Cl.
CPC ......... *H03B 5/1296* (2013.01); *H03B 5/1228* (2013.01); *H03B 5/1246* (2013.01); *H03B 5/1852* (2013.01); *H03L 7/099* (2013.01)

(58) Field of Classification Search
CPC .. H03B 5/1296; H03B 5/1228; H03B 5/1243; H03B 5/1852; H03B 2200/003; H03B 5/1246
USPC ................. 331/117 FE, 167, 177 V
See application file for complete search history.

(56) References Cited

U.S. PATENT DOCUMENTS

| 8,362,843 B2 * | 1/2013 | Kaczynski | ............ H03L 7/1976 331/177 V |
| 2012/0161890 A1 * | 6/2012 | Li | ........................ H03B 5/1256 331/117 FE |

* cited by examiner

*Primary Examiner* — Arnold M Kinkead
(74) *Attorney, Agent, or Firm* — Patterson + Sheridan, LLP

(57) ABSTRACT

Transformer based voltage controlled oscillator circuitry for phase-locked loop circuitry includes upper band circuitry and lower band circuitry. The upper band circuitry operates in a first frequency range and includes a first capacitor array having a variable capacitance. The lower band circuitry operates in a second frequency range and includes a second capacitor array having a variable capacitance. The first frequency range higher than the second frequency range. In a first operating mode, the first capacitor array has a first capacitance value and the second capacitor array has a second capacitance value. In a second operating mode, the second capacitor array has a third capacitance value different than the second capacitance value.

18 Claims, 10 Drawing Sheets

WIDE FREQUENCY RANGE VOLTAGE CONTROLLED OSCILLATORS

TECHNICAL FIELD

Examples of the present disclosure generally relate to voltage controlled oscillators, and, more particularly, transformer based voltage controlled oscillators having a wide operating range and low noise.

BACKGROUND

Wideband and low noise PLL circuitries are used in both wireline and wireless transceiver devices. In many instances, designing the transformer based voltage controlled oscillator (VCO) circuitries of a PLL circuitry to have a wide frequency range with low noise and low circuit area results in large tradeoffs in the design of the transformer based VCO circuitry. For example, a transformer based VCO circuitry designed to have low noise has a small variable capacitance (varactor). However, a transformer based VCO circuitry designed to handle large operating variations and a large frequency range with low noise has a large varactor (non-linear device), increasing the area of the transformer based VCO circuitry, reducing the range of the PLL circuitry, and increasing noise. In some conventional PLL circuitry designs, upper band (UB) and lower band (LB) circuitries, each covering a small frequency range with a large overlap between the UB and LB circuitries, are used. However, since the circuit area of the UB and LB circuities is large, the cost of the PLL circuitry is large as well.

A PLL circuitry design having transformer based VCO circuitry with a first inductance I1 and a second inductance I2 coupled with a coupling coefficient K has multiple operation modes (e.g., mode-0 and mode-1) based on the selected operating frequency of the PLL circuitry. The operating mode of the UB and LB circuitries is based on the inductor-capacitor ratio between the UB and LB circuitries. The mode of operation of the UB and LB circuitry is based on the inductance-capacitance ratio of the transformer based VCO circuitry. A transformer based VCO circuitry includes a selectable capacitor array (e.g., capacitor digital to analog converter (DAC)) having multiple capacitor units that can be selected to adjust the capacitance of the transformer based VCO circuitry. In one example, the capacitor array of each VCO circuitry of a PLL circuitry is controlled by a common control signal. Accordingly, the inductor-capacitor ratio remains constant between the UB and LB circuitries as the capacitance of the capacitor array is varied, thus reducing the operating range of VCO circuitry and the corresponding PLL circuitry.

SUMMARY

Phase-locked loop (PLL) circuitries that include transformer based inductance-capacitance (LC) voltage controlled oscillator (VCO) circuitries are described herein. A PLL circuitry includes transformer based VCO circuitry, where the mode of operation and frequency range of the transformer based VCO circuitry are based on the inductance-capacitance ratio between the upper band and lower band circuitries of the transformer based VCO circuitry. Decoupling capacitance values between the upper band and lower band circuitries, allows for the capacitance values of the upper band and lower band circuitries to be varied depending on the operating mode of the upper band and lower band circuitries. Further, decoupling the capacitance values increases the inductance-capacitance ratio, reducing erroneous mode switches. Accordingly, when operating in a first operating mode the inductance-capacitance ratio may be increased as compared to when operating in a second operating mode, increasing the operating range of the upper band and lower band circuitries, maintaining low operating noise, and not increasing the circuit area of the transformer based VCO circuitry.

In one example, transformer based VCO circuitry for PLL circuitry includes upper band circuitry and lower band circuitry. The upper band circuitry operates in a first frequency range and includes a first capacitor array having a variable capacitance. The lower band circuitry operates in a second frequency range and includes a second capacitor array having a variable capacitance. The first frequency range higher than the second frequency range. In a first operating mode, the first capacitor array has a first capacitance value and the second capacitor array has a second capacitance value. In a second operating mode, the second capacitor array has a third capacitance value different than the second capacitance value.

In one example, PLL includes transformer based VCO circuitry. The transformer based VCO circuitry includes upper band circuitry and lower band circuitry. The upper band circuitry operates in a first frequency range and includes a first capacitor array having a variable capacitance. The lower band circuitry operates in a second frequency range, and includes a second capacitor array having a variable capacitance. The first frequency range is higher than the second frequency range. In a first operating mode, the first capacitor array has a first capacitance value and the second capacitor array has a second capacitance value. In a second operating mode, the second capacitor array has a third capacitance value different than the second capacitance value.

In one example, a method includes generating, in a first mode, a second control signal based on a first control signal and an offset value. Further, the method includes adjusting, in the first mode, a capacitance value of a first capacitor array of upper band circuitry based on the first control signal. The method further includes adjusting, in the first mode, a capacitance value of a second capacitor array of a lower band circuitry based on the second control signal. The method includes generating, in a second mode, a third control signal, the third control signal different than the second control signal. The method includes adjusting, in the second mode, the capacitance value of the first capacitor array of the upper band circuitry based on the first control signal. Further, the method includes adjusting, in the second mode, the capacitance value of the second capacitor array of the lower band circuitry based on the third control signal.

BRIEF DESCRIPTION OF THE DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
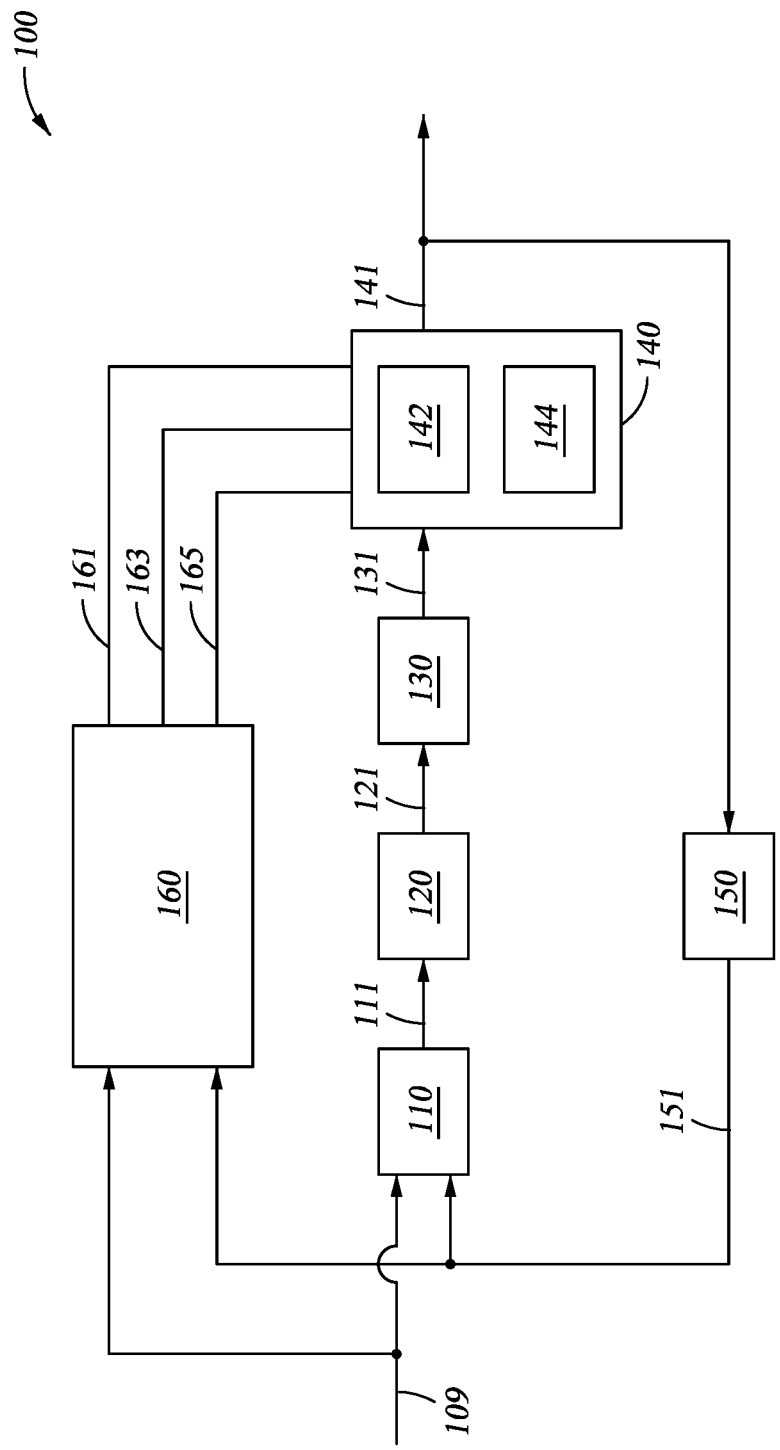
FIG. 1 is a schematic diagram of a phase-locked loop (PLL) circuitry, according to an example.

Communication devices include transceiver devices. The transceiver devices include phase-locked loop (PLL) circuitries that are used to generate clock signals. The PLL circuitries include transformer based voltage controlled oscillator (VCO) circuitry. The transformer based VCO circuitry may be a transformer based inductance capacitance (LC) VCO circuitry. A PLL circuitry includes a transformer based VCO circuitry having upper band and lower band circuitries, where the operating mode and frequency range of the upper band and lower band circuitries are based on the inductance-capacitance ratio between the upper band and lower band circuitries. Decoupling the capacitance values between the upper band and lower band circuitries, allows for upper band and lower band circuitries to handle large operating variations and a large frequency variation with low noise without increasing the circuit area of the corresponding transformer based VCO circuitry.

Lower band (LB) circuitry operates in a lower frequency. Upper band (UB) circuitry operates in an upper frequency band. The UB and LB circuitries include a capacitor array (e.g., a capacitive digital-to-analog converter (DAC)). A control signal having an offset is used to control the LB circuitry when the UB circuitry is selected, increasing the inductor-capacitance ratio between the LB circuitry and the UB circuitry.

The UB circuitry and the LB circuitry are selected based on an operating mode. In a first operating mode, the UB circuitry is selected, and the LB circuitry is deselected. In a second operating mode, the LB circuitry is selected, and the UB circuitry is deselected. The capacitance values between the UB and LB circuitries may be varied based on the selected operating mode, increasing the operating range of the UB and LB circuitries. For example, varying the capacitance values between the UB and LB circuitries depending on the operating mode adjusts the inductance capacitance ratio of the UB and LB circuitries. In one example, when operating in the first mode, the inductance capacitance ratio of the UB and LB circuitries is increased with regard to when operating in the second mode. An offset is applied to the capacitor array of the LB circuitry when operating in the first mode to increase the inductance capacitance ratio. When operating in the second mode, the offset is not applied to the capacitor array of the LB circuitry.

Decoupling the capacitance values, and the inductance-capacitance ratio between UB and LB circuitries, as described herein, decreases erroneous mode switching between of the UB and LB circuitries without increasing the circuit area size of the UB and LB circuitries. Further, decoupling the inductance capacitance ratio between UB and LB circuitries allows for smaller variable capacitors (varactors) to be used without reducing the noise performance of the UB and LB circuitries. Accordingly, the UB and LB circuitries as described herein have an increased operating range and improved noise performance as compared to conventional UB and LB circuitry designs.

FIG. 1 is a schematic block diagram of phase-locked loop (PLL) circuitry 100, according to one or more examples. The PLL circuitry 100 may be included within an integrated circuit (IC) device. In one example, an IC device may include multiple PLL circuitries 100. The transformer based VCO circuitry 140 includes UB circuitry 142 and LB circuitry 144.

The PLL circuitry 100 includes phase-frequency detector (PFD) circuitry 110, charge pump circuitry 120, filter circuitry 130, transformer based voltage controlled oscillator (VCO) circuitry 140, feedback divider circuitry 150, and control circuitry 160.

The PFD circuitry 110 receives the feedback signal 151 and reference clock signal 109 and generates the signal 111 from the feedback signal 151 and the reference clock signal 109. The signal 111 corresponds to a phase and/or frequency difference between the reference clock signal 109 and the feedback signal 151.

The charge pump circuitry 120 generates the signal 121 from the signal 111. The signal 121 corresponds to the phase and/or frequency difference between the reference clock signal 109 and the feedback signal 151. In one example, the charge pump circuitry 120 sources or sinks a constant current depending on which frequency of the reference clock signal 109 or the feedback signal 151 is higher.

The filter circuitry 130 filters the signal 121 to generate the filtered voltage signal 121. In one example, the filter circuitry 130 is a low pass filter (LPF) that integrates the signal 121 and outputs a continuously changing control voltage for the transformer based VCO circuitry 140. The filter circuitry 130 may include a resistive-capacitive (RC) circuit.

In one or more examples, once the phase different is less than $2\pi$, the PFD circuitry 110 controls the charge pump circuitry 120 via the signal 111 such that the charge pump circuitry 120 is only active for a portion of each phase of each cycle of the PFD circuitry 110 that is proportional to the phase difference between the reference clock signal 109 and the feedback signal 151. Based on the phase difference between the reference clock signal 109 and the feedback signal 151 reaching zero, the PLL circuitry 100 may be referred to be in a phase lock state.

The control circuitry 160 is coupled to the transformer based VCO circuitry 140, receives the reference clock signal 109 and the feedback signal 151, and outputs the control signals 161, 163, and 165 to the transformer based VCO circuitry 140. The control circuitry 160 generates the control signal 161, 163, and 165 from the reference clock signal 109 and the feedback signal 151.

The feedback divider circuitry 150 is coupled to the output of the transformer based VCO circuitry 140 and receives the output signal 141 from the transformer based VCO circuitry 140. The feedback divider circuitry 150 may additionally receive one or more control signals that provide a divisor for the feedback divider circuitry 150 to use in dividing the frequency of the output signal 141. The feedback divider circuitry 150 outputs the feedback signal 151 from the output signal 141 based on the divisor of the received control signal.

The control circuitry 160 is coupled to the output of the feedback divider circuitry 150 and receives the reference clock signal 109 and the feedback signal 151. The control circuitry 160 controls parameters of the transformer based VCO circuitry 140. For example, the control circuitry 160 controls the frequency selection of the transformer based VCO circuitry 140, the operating mode of the transformer based VCO circuitry 140, and the capacitive values of the transformer based VCO circuitry 140 based on the reference clock signal 109 and the feedback signal 151. The control circuitry 160 generates a control signal 161, a control signal 163, and a select signal 165. The control signal 161 controls the capacitance values (e.g., the value of the capacitor array) of the UB circuitry 142, the control signal 163 controls the capacitance values (e.g., the value of the capacitor array) of the LB circuitry 144, and the select signal 165 controls which of the UB circuitry 142 and the LB circuitry 144 is active. Controlling the capacitance values of the UB circuitry 142 and LB circuitry 144 adjust the oscillating frequency (e.g., operating frequency) of the transformer based VCO circuitry 140. Further, controlling which of the UB circuitry 142 and the LB circuitry 144 is active selects the operating mode of the transformer based VCO circuitry 140. The operating mode corresponds to the oscillating frequency (e.g., the operating frequency) of the transformer based VCO circuitry 140. For example, the transformer based VCO circuitry 140 may oscillate at an upper frequency (e.g., a first frequency), and a lower frequency (e.g., a second frequency). In one example, the upper frequency is at least about 10 GHz and the lower frequency is less than about 10 GHz. In other examples, other frequencies may be used.

Figure 2:
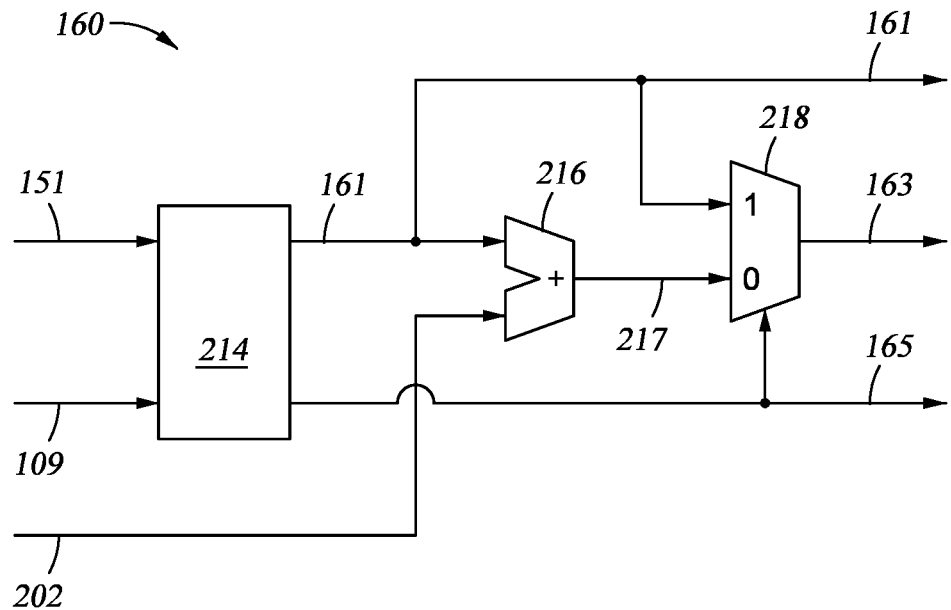
FIG. 2 is a partial schematic diagram of a control circuitry, according to an example.

FIG. 2 illustrates an example of the control circuitry 160, according to one or more examples. The control circuitry 160 includes tuning circuitry 214, arithmetic logic unit (ALU) circuitry 216, and multiplexer (MUX) 218.

The tuning circuitry 214 may be a finite state machine (FSM). The tuning circuitry 214 receives the reference clock signal 109 and the feedback signal 151. In one or more examples, the tuning circuitry 214 further receives one or more control signals. The tuning circuitry 214 outputs the control signal 161, the control signal 217, and the select signal 165. The UB control signal 161 and the control signal 217 are multi-bit outputs. For example, the UB control signal 161 and the control signal 217 are 7 bit outputs. In other examples, the UB control signal 161 and the control signal 217 are X bit outputs, where X is greater than 1.

The control signal 161 may be used for frequency selection within the UB circuitry 142. In one example, the UB control signal 161 may be used for coarse frequency selection within the UB circuitry 142. In one example, tuning circuitry 214 receives the control signal from a controller coupled to the tuning circuitry 214 and/or the PLL circuitry 100. In one example, the tuning circuitry 214 performs a binary search operation to select a frequency band for the UB circuitry 142 and the LB circuitry 144 based on a comparison of the frequency of the reference clock signal 109 and the feedback signal 151. In such an example, the PLL circuitry 100 receives a value N and a value F<k:0>, locks to the frequency ($F_{ref}$) of the reference clock signal 109, and controls frequency of the output signal 141 to be based on the value N, the value F and $F_{ref}$ (e.g., $N.F*F_{ref}$).

The control signal 161 is output to the ALU circuitry 216. The ALU circuitry 216 generates the control signal 217 based on the control signal 161 and the offset value 202. The offset value 202 is received by the ALU circuitry 216 from controller or processing system external to the PLL circuitry 100 or a controller or processing system that is part of the PLL circuitry 100. The offset signal 202 has an offset value that is used to adjust the LB circuitry 144. The ALU circuitry 216 outputs the control signal 217 to the MUX 218.

The MUX 218 receives the control signal 161 at a first input and the control signal 217 at a second input. Further, the MUX 218 receives the select signal 165. The select signal 165 controls the MUX 218 to select between the first input (e.g., the control signal 161) and the second input (e.g., the control signal 217). For example, based on the select signal 165 indicating that the UB circuitry 142 is to be selected (e.g., a high voltage value or a logic value of 1), the MUX 218 outputs the control signal 217 as the control signal 163. Further, based on the select signal 165 indicating that the LB circuitry 144 is to be selected (e.g., a low voltage value or a logic value of 0), the MUX 218 outputs the control signal 161 as the control signal 163. Accordingly, when the select signal 165 indicates that the LB circuitry 144 is to be selected, the control signal 161 and the control signal 163 are the same.

Figure 3:
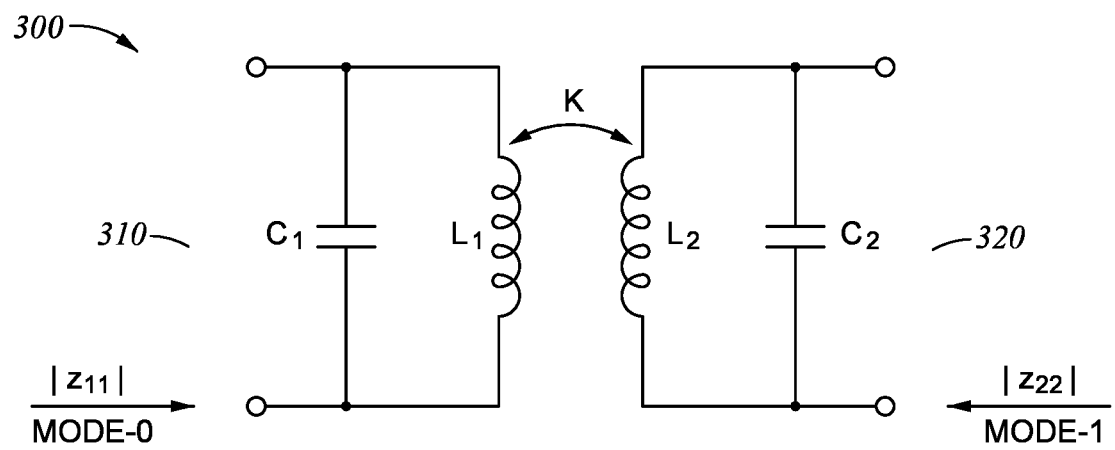
FIG. 3 is a schematic circuit diagram illustrating an impedance of inductors of a transformer based voltage controlled oscillator circuitry having a coupling coefficient K and corresponding capacitance and inductance, according to an example.

FIG. 3 illustrates a schematic circuit diagram illustrating the impedance of the inductors of a transformer based VCO circuitry 300, according to one or more examples. The transformer based VCO circuitry 300 has a coupling coefficient K. In one example, inductor L1 and capacitor C1 correspond to upper band circuitry 310 (e.g., the UB circuitry 142), and the inductor 12 and capacitor C2 correspond to lower band circuitry 320 (e.g., the LB circuitry 144 of FIG. 1). The ratio of L2C2/L1C1 determines the relative magnitude $|z_{11}|$ and $|z_{22}|$ of the frequency peaks of the operating modes (e.g., the first operating mode (mode-0), and the second operating mode (mode-1)). For example, when the ratio of L2C2/L1C1 is greater than 1.6, the transformer based VCO circuitry 300 functions in the second operating mode (e.g., mode-0).

Figure 4A:
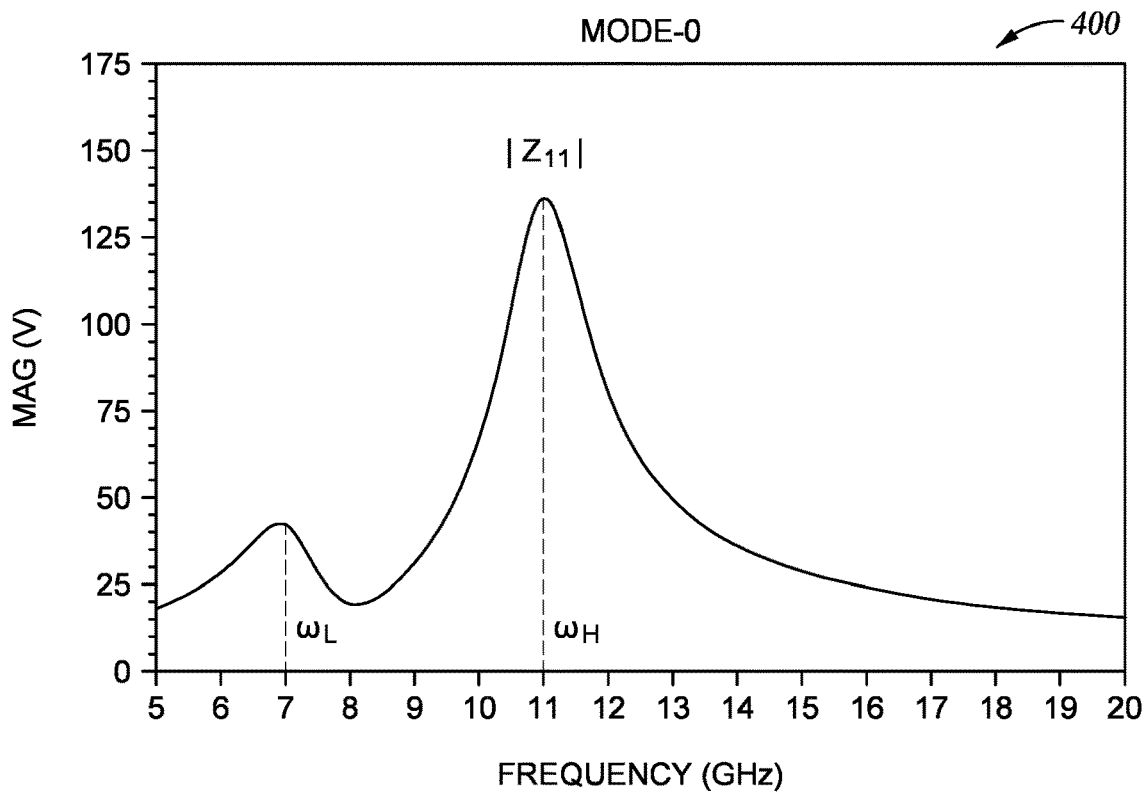
FIGS. 4A-B depict graphs corresponding to frequency peaks at different operating modes, according to an example.
Figure 4B:
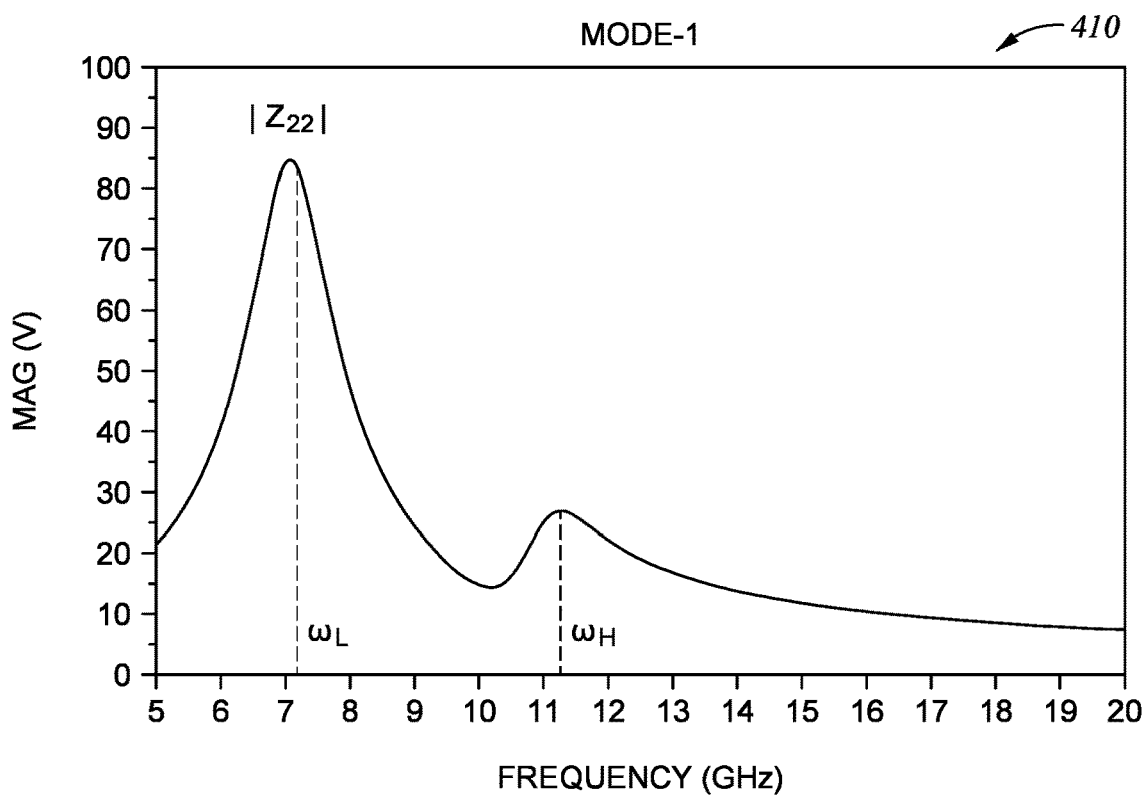
Figure 5A:
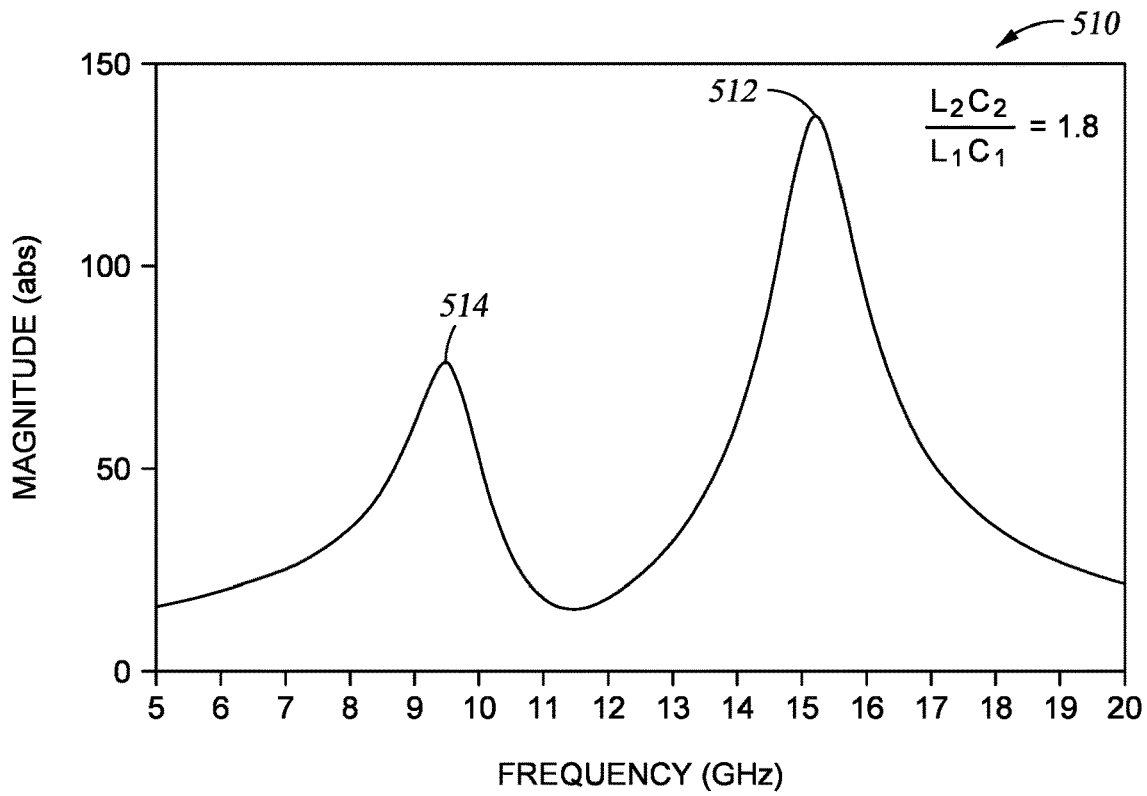
FIGS. 5A-5D depict graphs of voltage controlled oscillator circuitries operating in different modes based on the corresponding inductor capacitance ratio, according to an example.
Figure 5B:
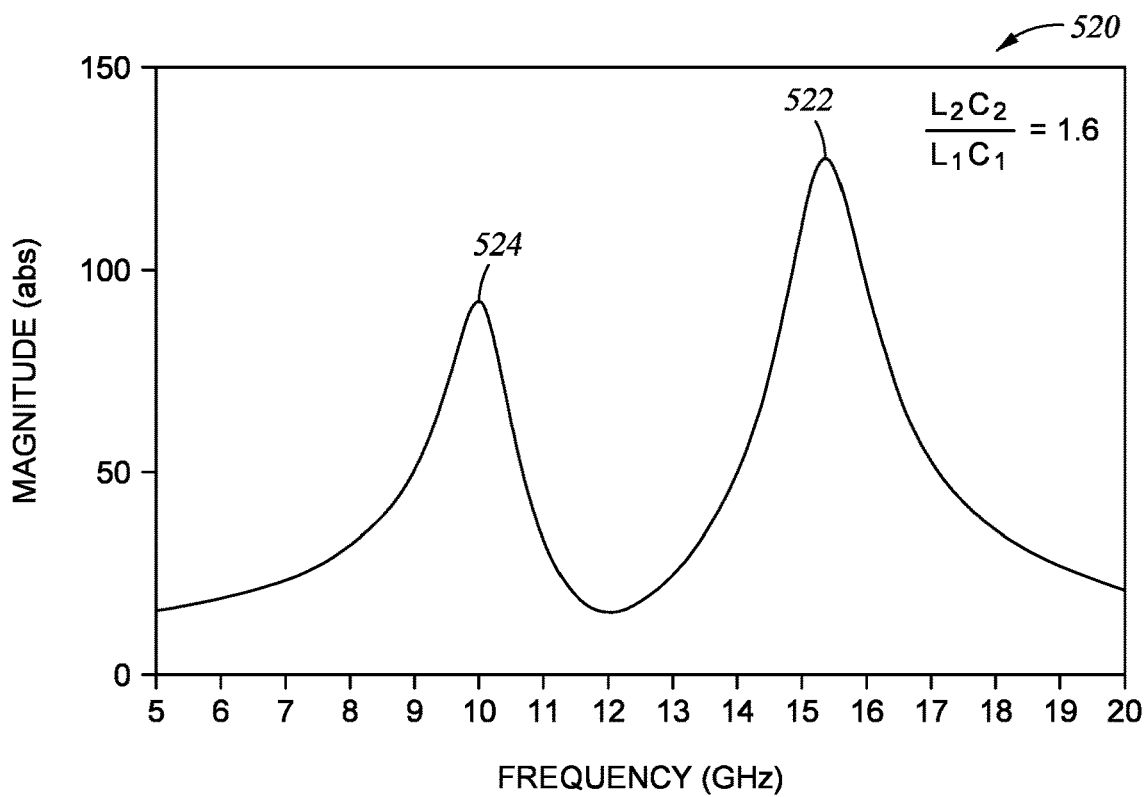
Figure 5C:
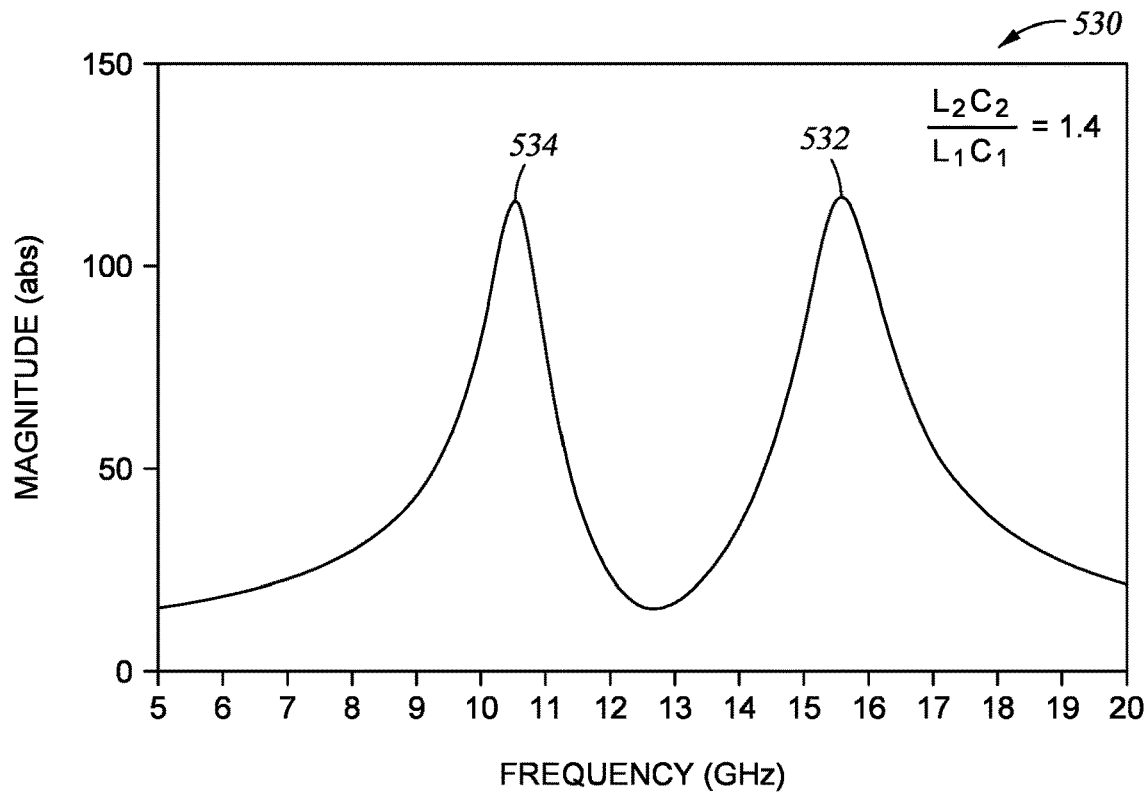
Figure 5D:
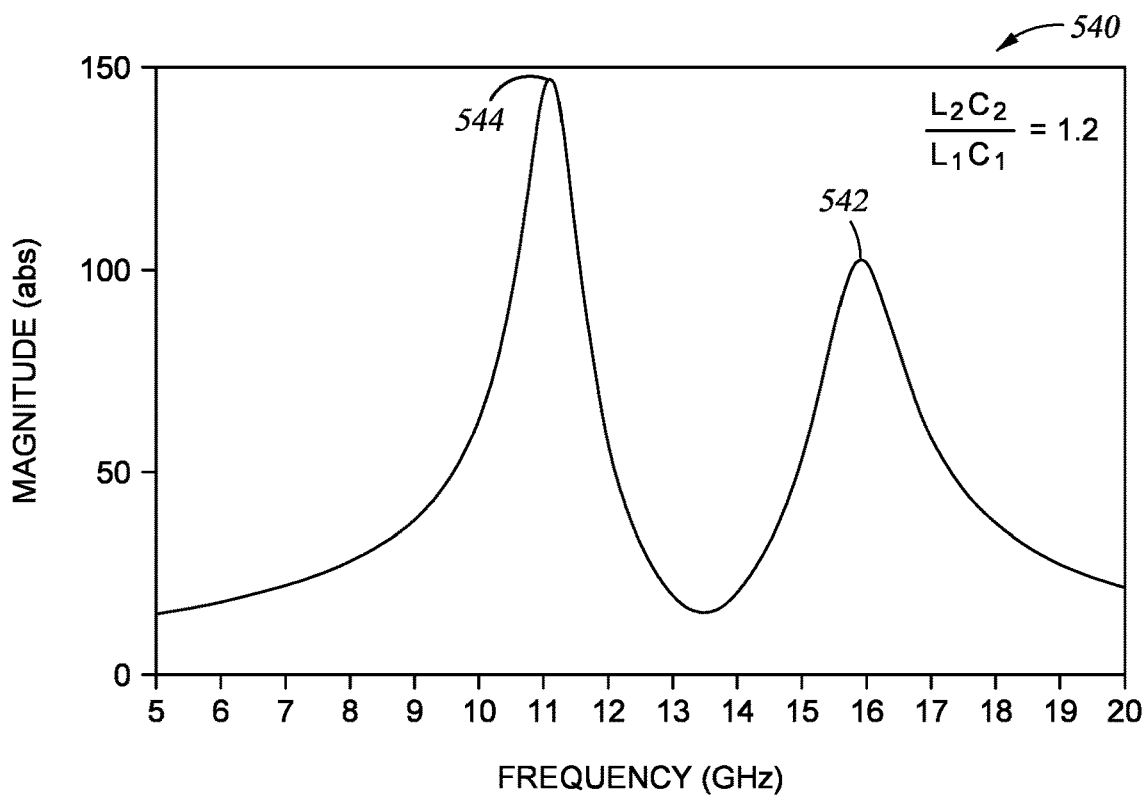

FIGS. 4A-4B illustrate graphs 400 and 410. The graph 400 corresponds to mode-0 and a frequency peak having a magnitude of $|z_{11}|$. The graph 410 corresponds to mode-1 and a frequency peak having a magnitude of $|z_{22}|$. The magnitudes $|z_{11}|$ and $|z_{22}|$ are the real part of the impedance of the transformer based VCO circuitry in the upper band and lower band, respectively, at the upper band operating frequency ($\omega_H$) and the low band operating frequency ($\omega_L$). In one example, when mode-0 is selected, the upper band circuitry 310 is selected and when mode-1 is selected, the lower band circuitry 320 is selected. When mode-0 is selected, the magnitude of impedance is increased at a higher frequency $\omega_H$ as is illustrated by the graph 400 of FIG. 4A and magnitude of impedance $|z_{11}|$. When mode-2 is selected, the magnitude is increased at a lower frequency $\omega_L$ as is illustrated by the graph 410 of FIG. 4B and the magnitude of impedance $|z_{22}|$. The frequency range for mode-0 is about 6.5 GHz to about 12 GHz, and the frequency range for mode-2 is about 10 GHz to about 18 GHz. To ensure that the mode of operation to be mode-1 (e.g., the operating mode of the UB circuitry 142), the ratio of L2C2/L1C1 is increased through the use of a control signal generated based on an offset. In such an example, the frequency range of the LB circuitry (e.g., the LB circuitry 144) can be increased without compromising the mode of operation when selecting the UB circuitry (e.g., UB circuitry 142) for operation. However, in conventional transformer based VCO circuitry designs, increasing the ratio of L2C2/L1C1 may increase noise within transformer based VCO circuitry as larger varactors are typically used and reduce the operating frequency range of the VCO circuitry. Further, in many conventional transformer based VCO circuitry designs, increasing the ratio of L2C2/L1C1 requires the use of a switch capacitor within the transformer based VCO circuitry, increasing the circuit area size of the transformer based VCO circuitry 300. In many conventional designs, to reduce the circuit area size and to improve noise of the transformer based VCO circuitry 300, smaller varactors are used decreasing the ratio of L2C2/L1C1. However, as the ratio of L2C2/L1C1 decreases, the transformer based VCO circuitry may erroneously switch from operating in mode-0 to operating in mode-1. Accordingly, the transformer based VCO circuitry operates at the incorrect frequency for the selected mode.

In conventional transformer based VCO circuitry design, the values of C1 and C2 are changed based on a common control signal. However, by decoupling the adjustment of the values of C1 from the adjustment of the values of C2 as is described in the following, the ratio of L2C2/L1C1 may be varied between the operating modes (e.g., mode-0 and mode-1), ensuring operation within mode-0, without employing circuit elements that increase the circuit area of the transformer based VCO circuitry. Accordingly, the transformer based VCO circuitry described herein provides improved performance without increasing the circuit area and the manufacturing cost of the transformer based VCO circuitry.

FIGS. 5A-5D illustrate graphs 510, 520, 530, and 540 that correspond to operating frequencies and modes of transformer based VCO circuitry (e.g., the transformer based VCO circuitry 140. In graph 510, the L2C2/L1C1 ratio is 1.8. Further, the frequency peak 512 (e.g., the high frequency peak) is larger than frequency peak 514 (e.g., low frequency peak) showing that mode-0 is the dominant mode of operation.

In graph 520, the L2C2/L1C1 ratio is 1.6. Further, the frequency peak 522 (e.g., the high frequency peak) is larger than frequency peak 524 (e.g., the low frequency peak) showing that mode-0 is the dominant mode of operation. However, as compared to the graph 510, the difference in the magnitude of impedance between the peaks 522 and 524 is less than the difference in the magnitude of impedance between the peaks 512 and 514.

In graph 530, the L2C2/L1C1 ratio is 1.4. Further, the magnitude of impedance of the frequency peak 532 (e.g., the high frequency peak) and the magnitude of impedance of the frequency peak 534 are similar (e.g., substantially the same). Based on the magnitude of impedance of the frequencies 532 and 534, and the corresponding phases, mode-0 or mode-1 may be the mode of operation.

In graph 540, the L2C2/L1C1 ratio is 1.2. The magnitude of impedance of the frequency peak 542 (e.g., the high frequency peak) is less than the magnitude of impedance of the frequency peak 544 (e.g., the low frequency peak). Based on the magnitude of impedance of the frequencies 542 and 544, and the corresponding phases, mode-1 is dominate. Mode-1 is dominate even if mode-0 is selected, and the corresponding transformer based VCO circuitry (e.g., transformer based VCO circuitry 140) may operate in mode-1

Figure 6:
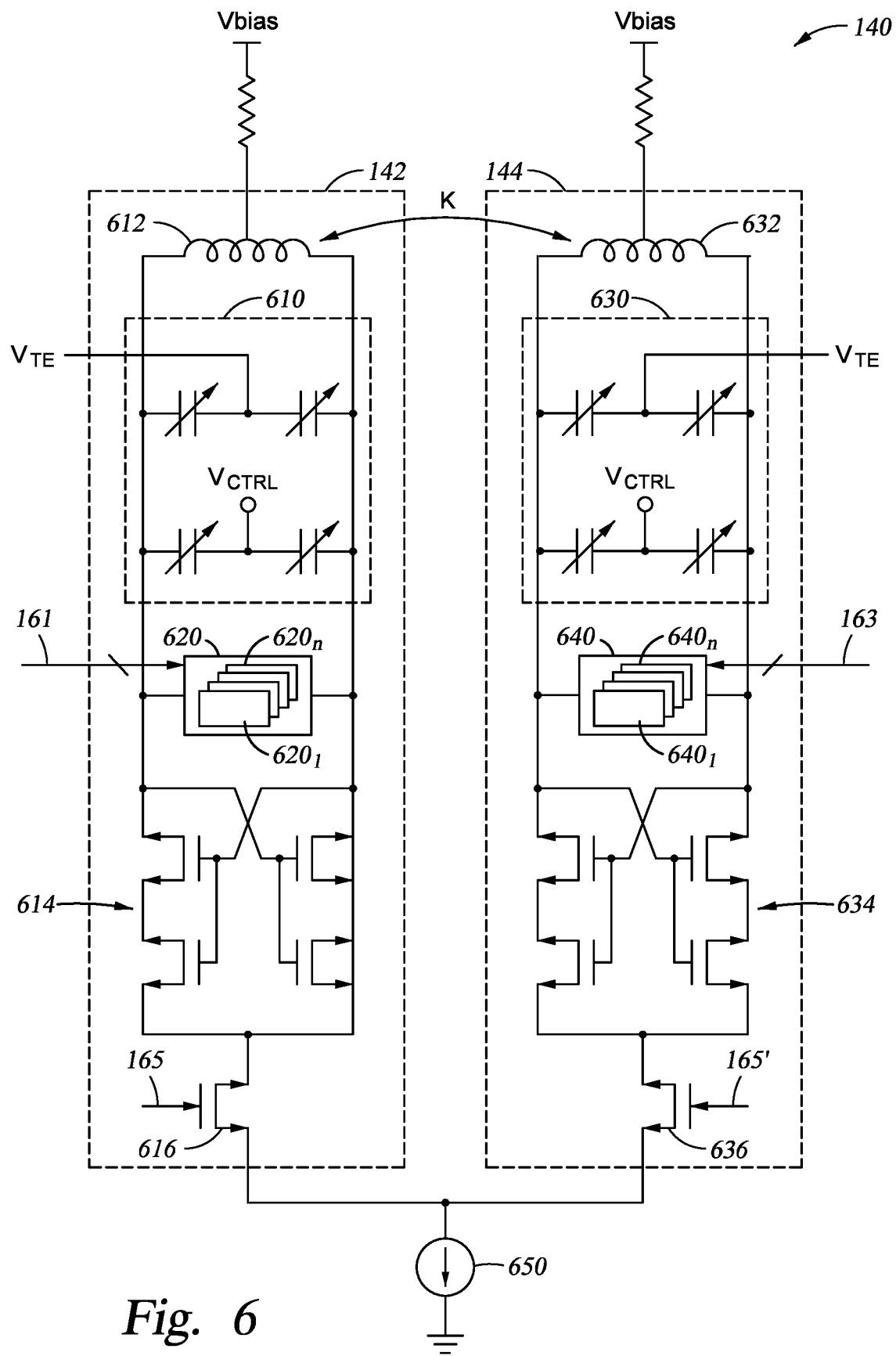
FIG. 6 illustrates a circuit diagram of a voltage controlled oscillator circuitry, according to an example.

FIG. 6 illustrates a circuit diagram of the transformer based VCO circuitry 140, according to one or more examples. The transformer based VCO circuitry 140 includes the UB circuitry 142 and the LB circuitry 144. The coupling coefficient K is formed between the UB circuitry 142 and the LB circuitry 144. As is described above with regard to FIG. 1, the transformer based VCO circuitry 140 receives the control signals 161, 163, and 165. Further, transformer based VCO circuitry 140 receives the voltage signals Vbias, Vte, and Vctl. The voltage signals Vbias and Vte are provided by one or more power supply devices, e.g., a voltage regulator or another power supply device. The voltage signal Vctl may be the signal 131 provided by the filter circuitry 130 of FIG.

The UB circuitry 142 includes varactors 610, inductor 612, and capacitor array (e.g., a capacitor DAC) 620. The inductor 612 is in parallel with the varactors 610 and the capacitor array 620. The UB circuitry 142 is connected to a voltage node via resistor to receive the voltage signal Vbias. The varactors 610 included one or more varactors disposed between a first and second node the UB circuitry 142 and in parallel with the inductor 612. The capacitance of the varactors 610 is variable such that a capacitance of the varactors may be selected and controlled. The oscillating signal generated across the first and second nodes of the varactors 610 corresponds to the capacitance of the varactors 610.

The capacitor array 620 includes capacitor units 6201-620N. The capacitor array 620 receives the control signal 161. The control signal 161 includes multiple bits. In one example, the control signal 161 is provided via a bus. Each of the capacitor units 6201-620N receives a bit of the control of the control signal 161. Each of the capacitor units 6201-620N may be individually controlled via a respective bit of the control signal 161. For example, a capacitor unit 6201-620N may be selectively turned on or turned off (e.g., connected or disconnected), adjusting the capacitance of the UB circuitry 142, adjusting the oscillating frequency of the UB circuitry 142.

The UB circuitry 142 further includes cross-coupled transistors 614 coupled between the capacitor array 620 and the selection transistor 616. The selection transistor 616 is coupled to the current source 650. The selection transistor 616 controls the connection between the UB circuitry 142 and the current source 650 based on the select signal 165. In one example, based on the select signal 165 having a high voltage value (e.g., a logic value of 1), the selection transistor 616 connects the UB circuitry 142 with the current source 650, turning on the UB circuitry 142. Further, based on the select signal 165 having a low voltage value (e.g., a logic value of 0), the selection transistor 616 disconnects the UB circuitry 142 from the current source 650, turning off the UB circuitry 142. The control signal 165 having a high voltage value corresponds to the mode-0.

The LB circuitry 144 includes varactors 630, inductor 632, and capacitor array 640. The inductor 632 is in parallel with the varactors 630 and the capacitor array 640. The LB circuitry 144 is connected to a voltage node via resistor to receive the voltage signal Vbias. The varactors 630 include one or more varactors disposed between a first and second node the LB circuitry 144 and in parallel with the inductor 632. The capacitance of the varactors 630 is variable such that a capacitance of the varactors may be selected and controlled. The oscillating signal generated across the first and second nodes of the varactors 630 corresponds to the capacitance of the varactors 630.

The capacitor array 640 includes capacitor units 6401-640N. The capacitor array 640 receives the control signal 163. The control signal 163 includes multiple bits. In one example, the control signal 163 is provided via a bus. Each of the capacitor units 6401-640N receives a bit of the control of the control signal 163. Each of the capacitor units 6401-640N may be individually controlled via a respective bit of the control signal 163. For example, the capacitor units 6401-640N are selectively turned on or turned off (e.g., connected or disconnected), adjusting the capacitance of the LB circuitry 144, adjusting the oscillating frequency of the LB circuitry 144.

The LB circuitry 144 further includes cross-coupled transistors 634 coupled between the capacitor array 640 and the selection transistor 636. The selection transistor 636 is coupled to the current source 650. The selection transistor 636 controls the connection between the LB circuitry 144 and the current source 650 based on the select signal 165. In one example, based on the select signal 165' having a high voltage value (e.g., a logic value of 1), the selection transistor 636 connects the LB circuitry 144 with the current source 650, turning on the LB circuitry 144. The select signal 165' is the inverse of the select signal 165. Further, based on the select signal 165' having a low voltage value (e.g., a logic value of 0), the selection transistor 636 disconnects the LB circuitry 144 from the current source 650, turning off the LB circuitry 144. The control signal having a high voltage value corresponds to the mode-1.

Figure 7:
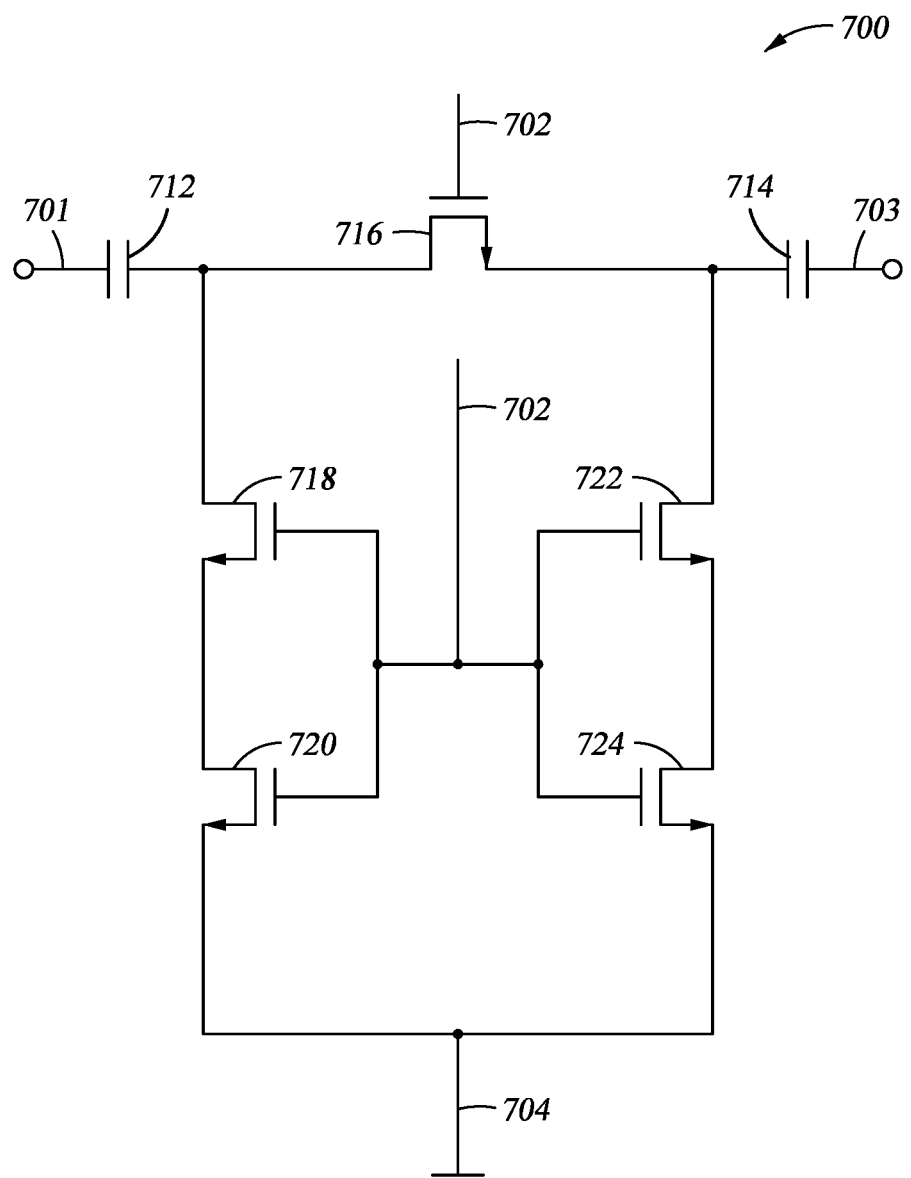
FIG. 7 illustrates a circuit diagram of a capacitor unit, according to an example.

FIG. 7 illustrates a circuit diagram of a capacitor unit 700, according to one or more examples. The capacitor unit 700 includes capacitors 712 and 714 disposed between the nodes 701 and 703. A transistor 716 is connected between the capacitors 712 and 714. The transistor 716 has a gate connected to a node that receives a control signal 702. The transistor 716 may be a PMOS transistor an NMOS transistor. In one example, the capacitor 712 is connected to a drain of the transistor 716 and the capacitor 714 is connected to the source of the transistor 716.

Transistors 718, 720, 722, and 724 are connected between the source and drain of the transistor 716. The transistors 718, 720, 722, and 724 are PMOS or NMOS transistors. The drain of the transistor 718 is connected to the drain of the transistor 716, and a source of the transistor 718 is connected to the drain of the transistor 720. The drain of the transistor 722 is connected to the source of the transistor 716, and the source of the transistor 722 is connected to the drain of the transistor 724. The source of the transistor 720 and the source of the transistor 724 are connected to a node that receives the control signal 704. In one example, the control signal 704 is the inverted version of the control signal 702. Further, the gates of the transistors 718, 720, 722, and 724 are connected to a node that receives the control signal 702.

In one example, based on the control signal 702 having a high voltage value (e.g., a logic value of 1), the transistors 716-724 are turned on and form a connection between the capacitors 712 and 714, the capacitor unit 700 is selected (e.g., turned on). Based on the control signal 702 having a high voltage value (e.g., a logic value of 1), the transistors 716-724 are turned off to disconnect capacitors 712 and 714 and deselect (e.g., turn off) the capacitor unit 700.

In one example, each of the capacitor units 6201-620N of the capacitor array 620 is configured similar to that of the capacitor unit 700. In such an example, the control signal 702 is the control signal 161. In another example, each of the capacitor units 6401-640N of the capacitor array 640 is configured similar to that of the capacitor unit 700. In such an example, the control signal 702 is the control signal 163.

With further reference to FIG. 6, based on the control signal 165 having a high voltage value (e.g., the mode-1), the control signal 163 have a first n-bit word (signal), and based on the select signal 165 having a low voltage value (e.g., mode-0), the control signal 163 is a second n-bit word. The number of bits of the control signal corresponds to the number of capacitors of the capacitor array. For example, the control signal 163 is an n-bit word having a bit for each capacitor of the capacitor array 640. In one example, the capacitor array has 7 capacitors and the n-bit word is a 7-bit word.

The control signal 163 is the same as the control signal 161 when the LB circuitry 144 is selected for operation (e.g., mode-1 is selected). When the UB circuitry 142 is selected for operation (e.g., mode-0 is selected) the control signal 163 differs from the control signal 161. When the UB circuitry 142 is selected for operation, the control signal 163 is the control signal 163 is generated based on the offset values 202 of FIG. 2.

When the UB circuitry 142 is selected for operation, the control signal 163 is generated based on the offset values 202 of FIG. 2 (e.g., mode-0). Accordingly, the capacitance value of the capacitor array 640 is increased to increase the inductance capacitance ratio between the LB circuitry 144 and the UB circuitry 142 (e.g., L2C2/L1C1). Increasing inductance capacitance ratio between the LB circuitry 144 and the UB circuitry 142 ensures that the transformer based VCO circuitry 140 operates in mode-0 when mode-0 is selected (e.g., the UB circuitry 142 is selected).

In one example, adding the offset values 202 ensures that the inductance capacitance (e.g., L2C2/L1C12) ratio between the LB circuitry 142 and the UB circuitry 144 is at least about 1.6. In other examples, adding the offset values 202 ensures that the inductance capacitance (e.g., L2C2/L1C1) ratio between the LB circuitry 144 and the UB circuitry 142 is at a value that ensures the transformer based VCO circuitry 140 operates in the selected mode-0.

Figure 8:
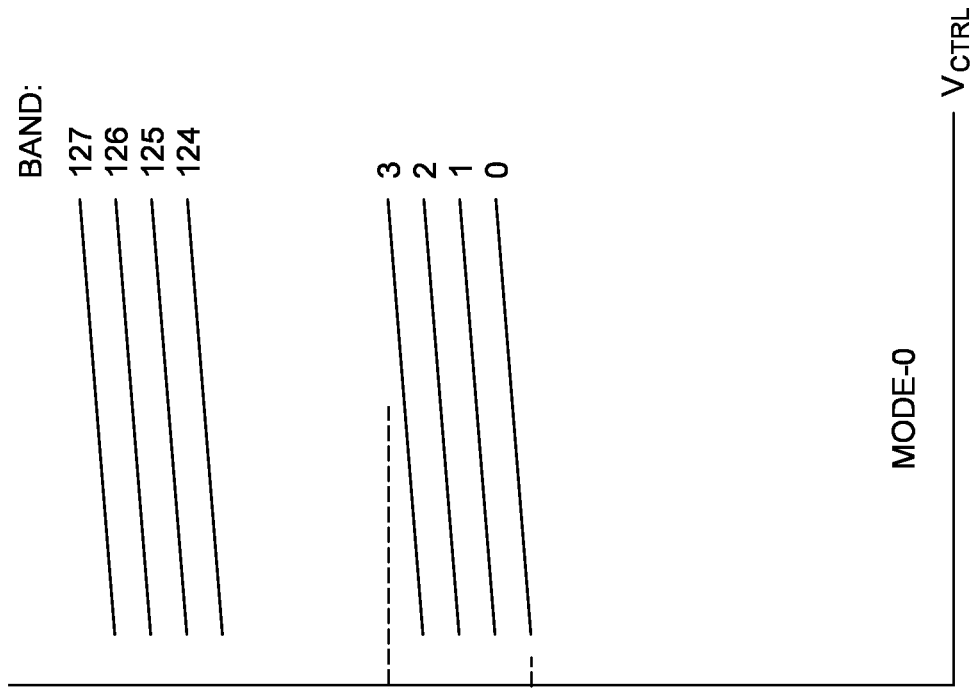
FIG. 8 is a chart depicting an overlap between operating frequency bands, according to an example.
Figure 8:
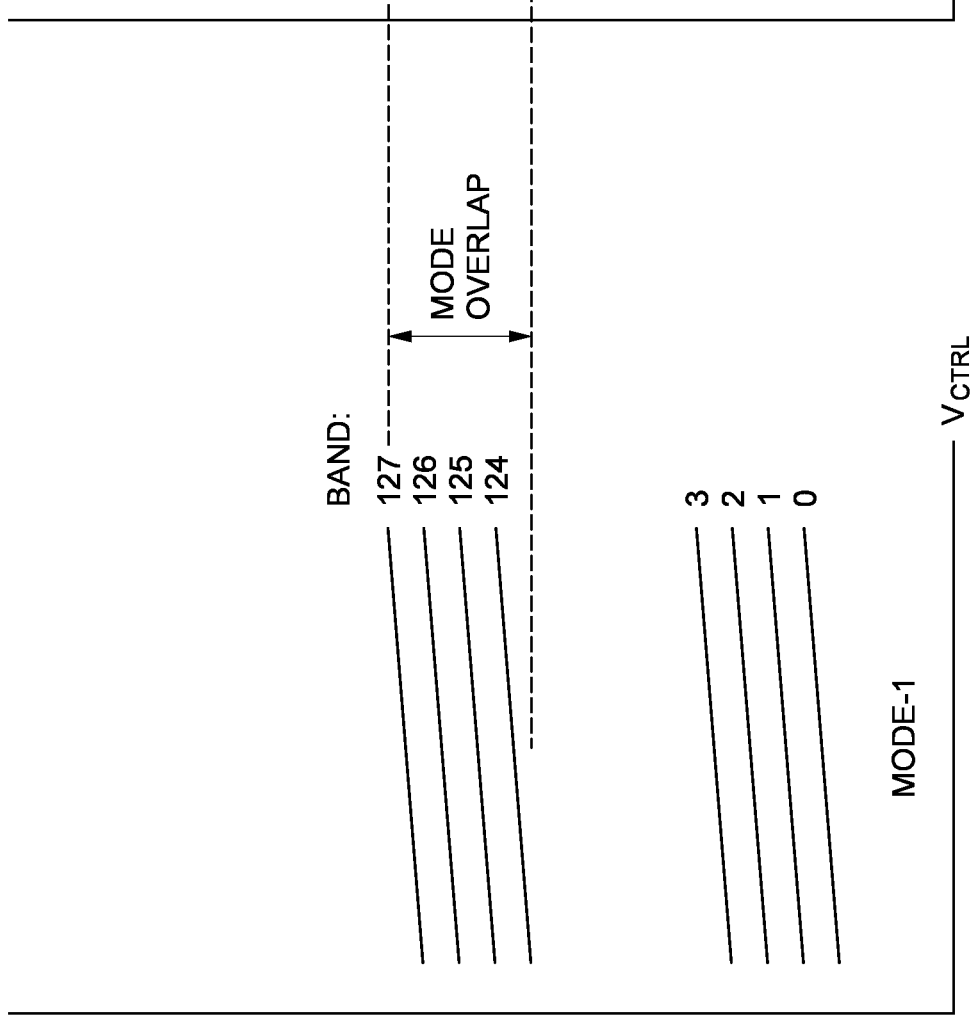

FIG. 8 depict graphs that illustrate overlap between the control codes of mode-0 and mode-1. As is illustrated in FIG. 8, the control codes associated with frequency bands 122-127 of mode-1 overlap with the control codes associated with frequency bands 0-3 of mode-0. The region of overlap between mode-0 and mode-1 may be adjusted by varying the inductance capacitance ration between the corresponding upper band and lower band circuitries (e.g., the UB circuitry 142 and the LB circuitry 144). If a control signal is selected that is part of the region of the overlap, the operating mode of the upper band and lower band circuitries may inadvertently switch. For example, the upper band and lower band circuitries may inadvertently switch from operating in mode-0 to operating in mode-1. In one example, when operating in mode-0, the region of overlap may be mitigated by increasing the capacitance of LB circuitry 144 by using an offset value (e.g., the offset value 202) as is described above.

Figure 9:
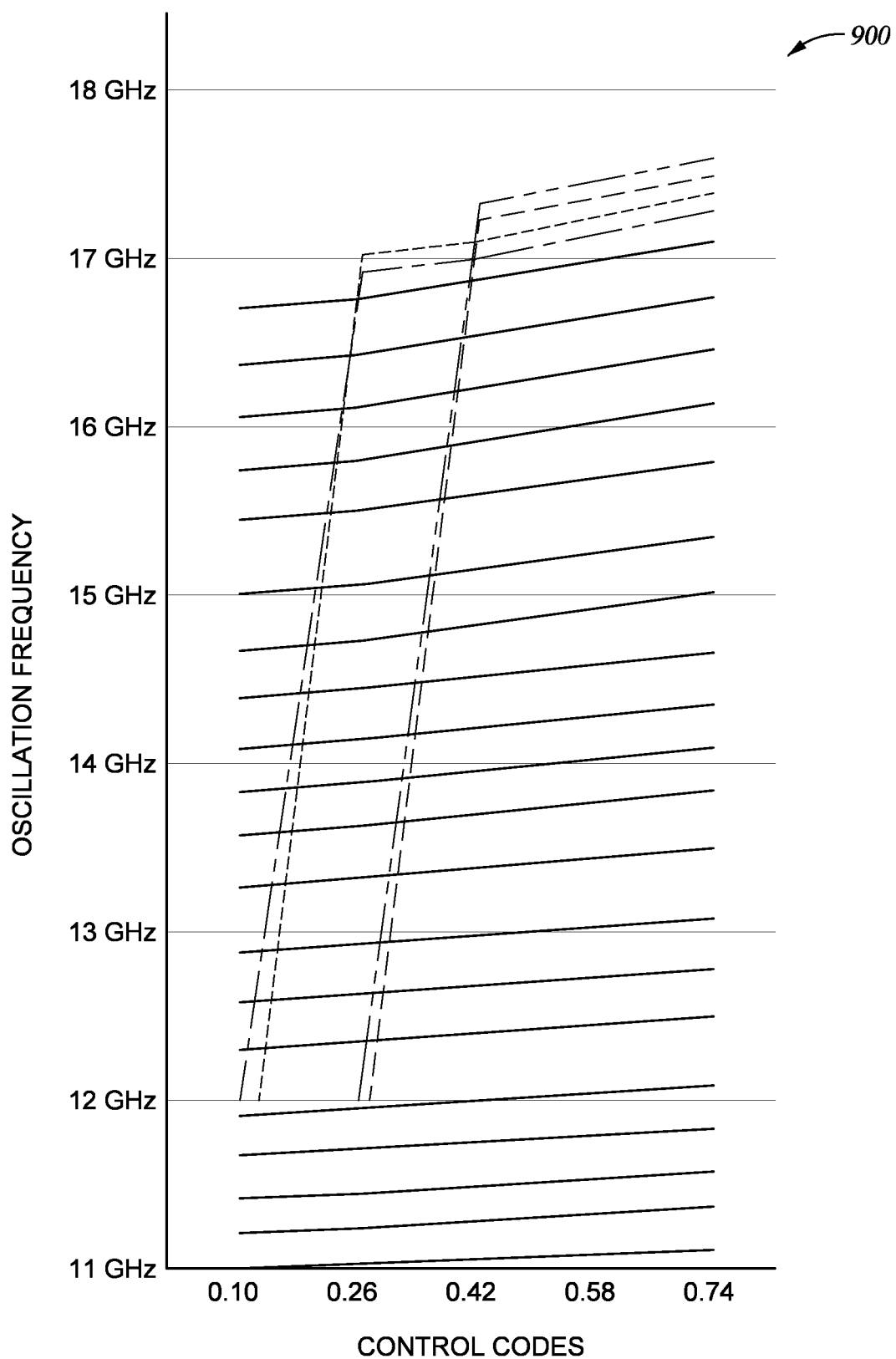
FIG. 9 depicts a graph of operating frequencies of a transformer based VCO circuitry, according to an example.

FIG. 9 illustrates the graph 900 including example oscillation frequencies of a transformer based VCO circuitry (e.g., the transformer based VCO circuitry 140). As is illustrated in FIG. 9, when the L2C2/L1C1 ratio between the LB circuitry (e.g., LB circuitry 144) and the UB circuitry (e.g., UB circuitry 142) is less than 1.4, the transformer based VCO circuitry switches from operating in mode-0 to operating in mode-1. For example, when mode-0 is selected with a corresponding oscillation frequency of at least about 17 GHz, the transformer based VCO circuitry switches to mode-1 and has an oscillation frequency of about 12 GHz. As is described above, an offset may be added to the control signal of the LB circuitry to increase the capacitance of the LB circuitry when the transformer based VCO circuitry is operating in mode-0. Accordingly, the L2C2/L1C1 ratio is increased, and the transformer based VCO circuitry continues to operate in mode-0 at higher frequencies (e.g., at least about 17 GHz). In one example, the L2C2/L1C1 ratio is increased to be at least about 1.6.

Figure 10:
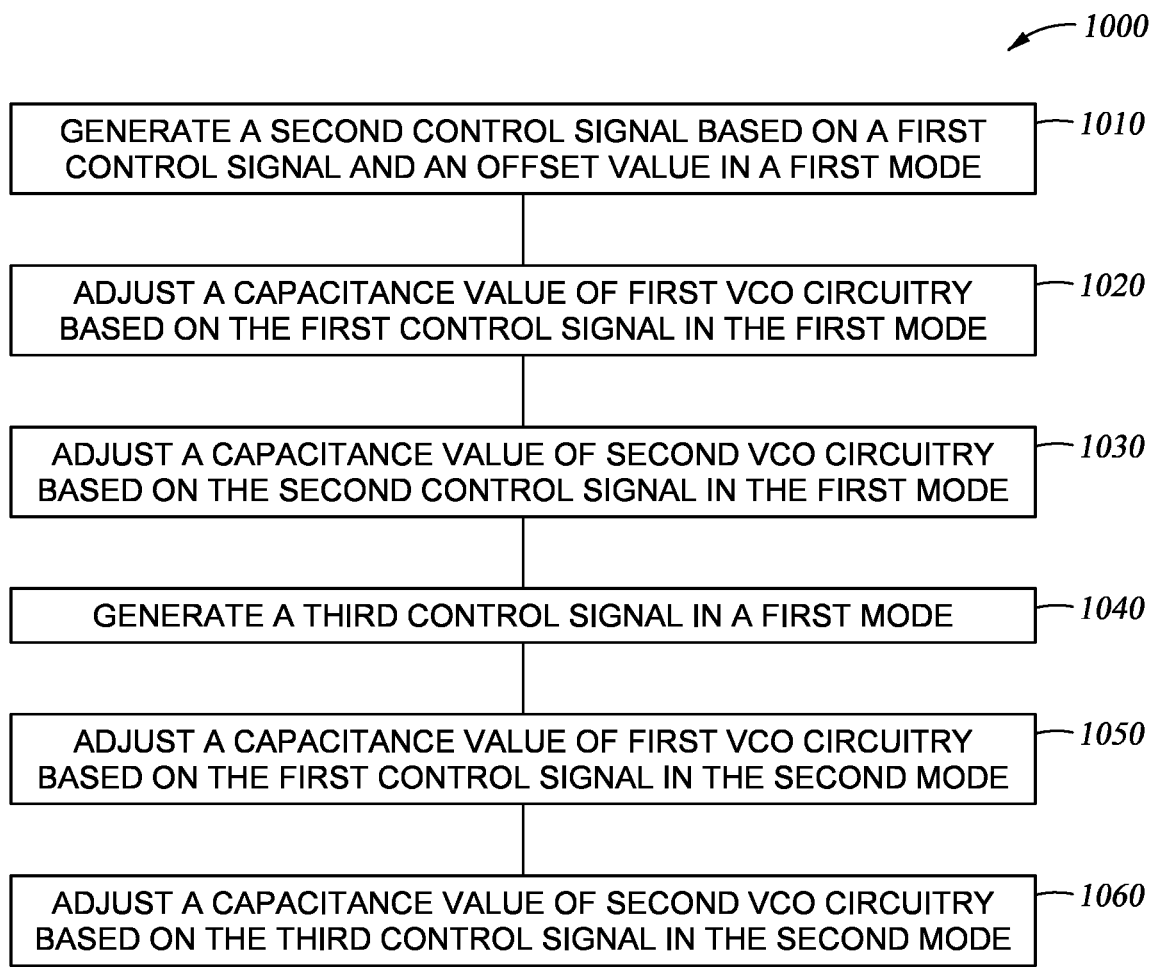
FIG. 10 is a flow chart of a method for operating a voltage controlled oscillator circuitry, according to an example.

FIG. 10 illustrates a flow chart of a method 1000 for operating transformer based VCO circuitry (e.g., the transformer based VCO circuitry 140 of FIG. 1). At block 1010 of the method 1000, in a first mode, a second control signal is generated based on a first control signal and an offset value. For example, with reference to FIG. 2, the control circuitry 160 generates the control signal 163 based on the control signal 161 and the offset value 202. In one example, the ALU circuitry 216 receives the offset value 202 and the control signal 161 and generates the control signal 217. The controls signal 161 is generated by the tuning circuitry 214 based on a phase and/or frequency difference between the feedback signal 151 and the reference clock signal 109. The MUX 218 receives the control signal 217 and the control signal 161 and selects the control signal 217 to be output as the control signal 163 based on the select signal 165 indicating mode-0.

At block 1020 of the method 1000, in the first mode, a first capacitance value of UB circuitry is adjusted based on the first control signal. For example, with reference to FIG. 6, the capacitance value of the capacitor array 620 of the UB circuitry 142 is adjusted based on the control signal 161. The control signal 161 is an n-bit word that indicates which of the capacitor units 6201-620N are to be selected and which are to be deselected. Selecting more of the capacitor units 6201-620N increases the capacitance of the capacitor array 620 and selecting less of the capacitor units 6201-620N decreases the capacitance of the capacitor array 620.

At block 1030 of the method 1000, in the first mode, a second capacitance value of UB circuitry is adjusted based on the second control signal. For example, with reference to FIG. 6, the capacitance value of the capacitor array 640 of the LB circuitry 144 is adjusted based on the control signal 163, where the control signal 163 is the control signal 217. The control signal 163 is an n-bit word that indicates which of the capacitor units 6401-640N are to be selected and which are to be deselected. Selecting more of the capacitor units 6401-640N increases the capacitance of the capacitive array 640 and selecting less of the capacitor units 6401-640N decreases the capacitance of the capacitor array 640.

At block 1040 of the method 1000, in a second mode, a third control signal is generated. For example, with reference to FIG. 2, the control circuitry 160 generates the control signal 163 based on the control signal 161. For example, the MUX 218 receives the control signal 217 and the control signal 161 and selects the control signal 161 to be output as the control signal 163 based on the select signal 165 indicating mode-1.

At block 1050 of the method 1000, in the second mode, a capacitance value of the UB circuitry is adjusted based on the first control signal. For example, with reference to FIG. 6, the capacitance value of the capacitor array 620 of the UB circuitry 142 is adjusted based on the control signal 161.

At block 1060 of the method 1000, in the second mode, a capacitance value of the LB circuitry is adjusted based on the third control signal. For example, with reference to FIG. 6, the capacitance value of the capacitor array 640 of the LB circuitry 144 is adjusted based on the control signal 163, where the control signal 163 is the control signal 161. In block 1060 the capacitance value of the capacitor array 640 is less than the capacitance value of the capacitor array at block 1030. Accordingly, at block 1030, and when operating mode-0, the inductance capacitance ratio between the LB circuitry 144 and the UB circuitry 142 is greater than the inductance ratio between the LB circuitry 144 and the UB circuitry 142 at block 1060 and operating in mode-1.

The capacitance values between different modes of upper band and lower band circuitries of a PLL circuitry are decoupled. Accordingly, the inductance capacitance ratio between the UB and LB circuitries when operating in a first mode (e.g., mode-0) can be increased as compared to the inductance capacitance ratio when operating in a second mode (e.g., mode-1). Increasing the inductance capacitance ratio ensures that the transformer based VCO circuitry continues to operate in mode-0 at higher frequencies (e.g., at least about 17 GHz) when mode-0 is selected. Further, as compared to conventional transformer based VCO circuitry designs, the UB and LB circuitries described herein have a reduced circuit area and decreased noise, providing improved performance and reduced manufacturing costs.

While the foregoing is directed to specific examples, other and further examples may be devised without departing from the basic scope thereof, and the scope thereof is determined by the claims that follow.

What is claimed is:

1. A transformer based voltage controlled oscillator (VCO) circuitry comprising:
upper band circuitry configured to operate in a first frequency range and comprising a first capacitor array having a variable capacitance; and
lower band circuitry configured to operate in a second frequency range and comprising a second capacitor array having a variable capacitance, the first frequency range higher than the second frequency range, wherein:
in a first operating mode, the first capacitor array has a first capacitance value and the second capacitor array has a second capacitance value; and
in a second operating mode, the second capacitor array has a third capacitance value, wherein the third capacitance value is less than the second capacitance value.

2. The transformer based VCO circuitry of claim 1, wherein:
in the first operating mode and the second operating mode, the first capacitor array is configured to receive a first control signal;
in the first operating mode, the second capacitor array is configured to receive a second control signal; and
in the second operating mode, the second capacitor array is configured to receive a third control signal, wherein the second control signal differs from the third control signal.

3. The transformer based VCO circuitry of claim 2, wherein the upper band circuitry and the lower band circuitry are coupled to tuning circuitry configured to:
in the first operating mode, output the first control signal to the first capacitor array and the second control signal to the second capacitor array; and
in the second operating mode, output the third control signal to the second capacitor array.

4. The transformer based VCO circuitry of claim 3, wherein the tuning circuitry is further configured to, in the first operating mode, generate the second control signal from the first control signal and an offset value.

5. The transformer based VCO circuitry of claim 3, wherein the tuning circuitry is configured to select one of the second control signal and the third control signal based on a mode select signal, wherein the mode select signal is indicative of one of the first operating mode and the second operating mode.

6. The transformer based VCO circuitry of claim 1, wherein, in the second operating mode, the first capacitor array has the first capacitance value.

7. A phase-locked loop (PLL) circuitry comprising:
transformer based voltage control oscillator (VCO) circuitry comprising:
upper band circuitry configured to operate in a first frequency range and comprising a first capacitor array having a variable capacitance; and
lower band circuitry configured to operate in a second frequency range and comprising a second capacitor array having a variable capacitance, the first frequency range higher than the second frequency range, wherein:
in a first operating mode, the first capacitor array has a first capacitance value and the second capacitor array has a second capacitance value; and
in a second operating mode, the second capacitor array has a third capacitance value, wherein the third capacitance value is less than the second capacitance value.

8. The PLL circuitry of claim 7, wherein:
in the first operating mode and the second operating mode, the first capacitor array is configured to receive a first control signal;
in the first operating mode, the second capacitor array is configured to receive a second control signal; and
in the second operating mode, the second capacitor array is configured to receive a third control signal, wherein the second control signal differs from the third control signal.

9. The PLL circuitry of claim 8 further comprising tuning circuitry configured to:
in the first operating mode, output the first control signal to the first capacitor array and the second control signal to the second capacitor array; and
in the second operating mode, output the third control signal to the second capacitor array.

10. The PLL circuitry of claim 9, wherein the tuning circuitry is further configured to, in the first operating mode, generate the second control signal from the first control signal and an offset value.

11. The PLL circuitry of claim 9, wherein the tuning circuitry is configured to select one of the second control signal and a third control signal based on a mode select signal, wherein the mode select signal is indicative of one of the first operating mode and the second operating mode.

12. The PLL circuitry of claim 7, wherein, in the second operating mode, the first capacitor array has the first capacitance value.

13. A method comprising:
generating, in a first mode, a second control signal based on a first control signal and an offset value;
adjusting, in the first mode, a capacitance value of a first capacitor array of upper band circuitry based on the first control signal;
adjusting, in the first mode, a capacitance value of a second capacitor array of a lower band circuitry based on the second control signal;
generating, in a second mode, a third control signal, the third control signal different than the second control signal;
adjusting, in the second mode, the capacitance value of the first capacitor array of the upper band circuitry based on the first control signal; and
adjusting, in the second mode, the capacitance value of the second capacitor array of the lower band circuitry based on the third control signal.

14. The method of claim 13, wherein the upper band circuitry is configured to operate in a first frequency range, and the lower band circuitry is configured to operate in a second frequency range, and wherein the first frequency range is higher than the second frequency range.

15. The method of claim 13 further comprising:
receiving the first control signal at the first capacitor array of the upper band circuitry, and wherein adjusting the capacitance value of the lower band circuitry comprising adjusting the capacitance value of the first capacitor array; and
receiving the second control signal and the third control signal at the second capacitor array of the lower band circuitry, and wherein adjusting the capacitance value of the lower band circuitry comprising adjusting the capacitance value of the second capacitor array based on the second control signal and the third control signal.

16. The method of claim 13 further comprising:
selecting, in the first mode, the upper band circuitry for operation and deselecting the lower band circuitry for operation; and
selecting, in the second mode, the lower band circuitry for operation and deselecting the upper band circuitry for operation.

17. The method of claim 13 further comprising:
selecting the second control signal from the second control signal and the third control signal based on a selection signal indicating the first mode; and
selecting the third control signal from the second control signal and the third control signal based on the selection signal indicating the second mode.

18. The method of claim 13, wherein the capacitance value of the second capacitor array in the first mode is greater than the capacitance value of the second capacitor array in the second mode.

* * * * *